United States Patent [19]
Reddy

[11] Patent Number: 5,315,172
[45] Date of Patent: May 24, 1994

[54] REDUCED NOISE OUTPUT BUFFER

[75] Inventor: Srinivas T. Reddy, Santa Clara, Calif.

[73] Assignee: Altera Corporation, San Jose, Calif.

[21] Appl. No.: 868,399

[22] Filed: Apr. 14, 1992

[51] Int. Cl.$^5$ ............................................. H03K 17/16
[52] U.S. Cl. ................................... 307/443; 307/263; 307/451
[58] Field of Search ................ 307/443, 448, 451, 263

[56] References Cited

U.S. PATENT DOCUMENTS

| | | | |
|---|---|---|---|
| 4,638,187 | 1/1987 | Boler et al. | 307/451 |
| 4,771,195 | 9/1988 | Stein | 307/572 |
| 4,789,796 | 12/1988 | Foss | 307/443 |
| 4,961,010 | 10/1990 | Davis | 307/443 |
| 5,036,222 | 7/1991 | Davis | 307/263 |
| 5,089,722 | 2/1992 | Amedeo | 307/263 |
| 5,138,194 | 9/1992 | Yoeli | 307/263 |

Primary Examiner—Edward P. Westin
Assistant Examiner—Andrew Sanders
Attorney, Agent, or Firm—Townsend and Townsend Khourie and Crew

[57] ABSTRACT

The output buffer includes first and second N channel FETs serially connected between a ground terminal and a voltage supply terminal and having a common terminal connected to an output terminal. Third and fourth N channel FETs are serially connected between the ground terminal and the voltage supply terminal and have a common terminal connected to the output terminal. A first logic circuit responds to data input (DIN) signals and an operation enable bar (OEB) signal for applying a conductive bias voltage to the third N channel FET, and a second logic circuit responds to the DIN signals and the OEB signal for applying a conductive bias voltage to the fourth N channel FET. A first P channel FET couples the conductive bias voltage on the third N channel FET to the first N channel FET, and a second P channel FET couples the conductive bias on the fourth N channel FET to the second N channel FET. The P channel transistors are mask programmable weak conductors thus limiting the rate of conductive bias applied to the first N channel FET and to the second N channel FET. Fifth and sixth N channel FETs are connected between the gate terminals of the first and second FETs and circuit ground for preventing conduction of the first and second FETs when the fifth and sixth FETs are conductive.

20 Claims, 1 Drawing Sheet

A REDUCED NOISE OUTPUT BUFFER WITH NMOS PULLUP AND NMOS PULLDOWN TRANSISTORS

A REDUCED NOISE OUTPUT BUFFER WITH NMOS PULLUP AND NMOS PULLDOWN TRANSISTORS

REDUCED NOISE OUTPUT BUFFER

BACKGROUND OF THE INVENTION

This invention relates generally to output buffer circuits as used in integrated circuits such as programmable logic devices, and more particularly the invention relates to an output buffer which has reduced noise when switching states of an output.

The output pins and associated capacitances of integrated circuits are often connected to external ground leads and external voltage leads through pull-down and pull-up transistors, respectively, which are controlled by data signals generated within the integrated circuit. The leads have inductance associated therewith, and a voltage given by the inductance, L, multiplied by the time rate of change of current, di/dt, develops across the leads during voltage transitions. When multiple outputs connected to the leads switch, the time rate of change of current, di/dt, can be high thereby causing noise voltages to be developed across the leads. Consequently, the internal ground reference network can be at a different potential than the external ground thereby resulting in device inputs and outputs behaving differently than expected with consequential erroneous circuit operation.

Many buffer circuits have been proposed for reducing noise on output terminals by limiting the rate at which the output pin capacitance can charge and discharge, thus reducing the time rate of change of current. U.S. Pat. No. 4,789,796 discloses an output buffer having a sequentially switched output; U.S. Pat. No. 4,771,195 utilizes a plurality of subtransistors in the charging/discharging paths; U.S. Pat. No. 4,638,187 includes a pull-up circuit having parallel P channel and N channel FETs and a pull-down circuit having a pair of N channel FETs with a delay resistance between their gates; and U.S. Pat. No. 4,961,010 utilizes primary and secondary pull-up and pull-down transistors with delay resistance to delay turn on of the primary transistors.

SUMMARY OF THE INVENTION

The present invention provides an improved output buffer with reduced noise. Two N channel FETs (e.g. NMOS FETs) are utilized in each of the pull-up and pull-down circuits with smaller transistors providing limited current paths in parallel with the current path of the larger transistors. Weak P channel FETs are connected in the bias circuitry for the larger transistors and limits the change in conduction of the transistors.

In a preferred embodiment, two NAND gates respond to data and enable signal inputs and selectively bias the N channel and P channel FETs to effect a change in the voltage on the output pin. A tristate mode of operation is permitted by the output enable signal being low.

In a preferred embodiment, N channel FETs selectively latch the bias circuitry of the larger transistors to ground to prevent current flow through the transistors.

The invention and objects and features thereof will be more readily apparent from the following detailed description and appended claims when taken with the drawings.

BRIEF DESCRIPTION OF THE DRAWING

The drawing is a schematic of a preferred embodiment of an output buffer in accordance with the invention.

DETAILED DESCRIPTION OF THE ILLUSTRATIVE EMBODIMENT

Figure 1:
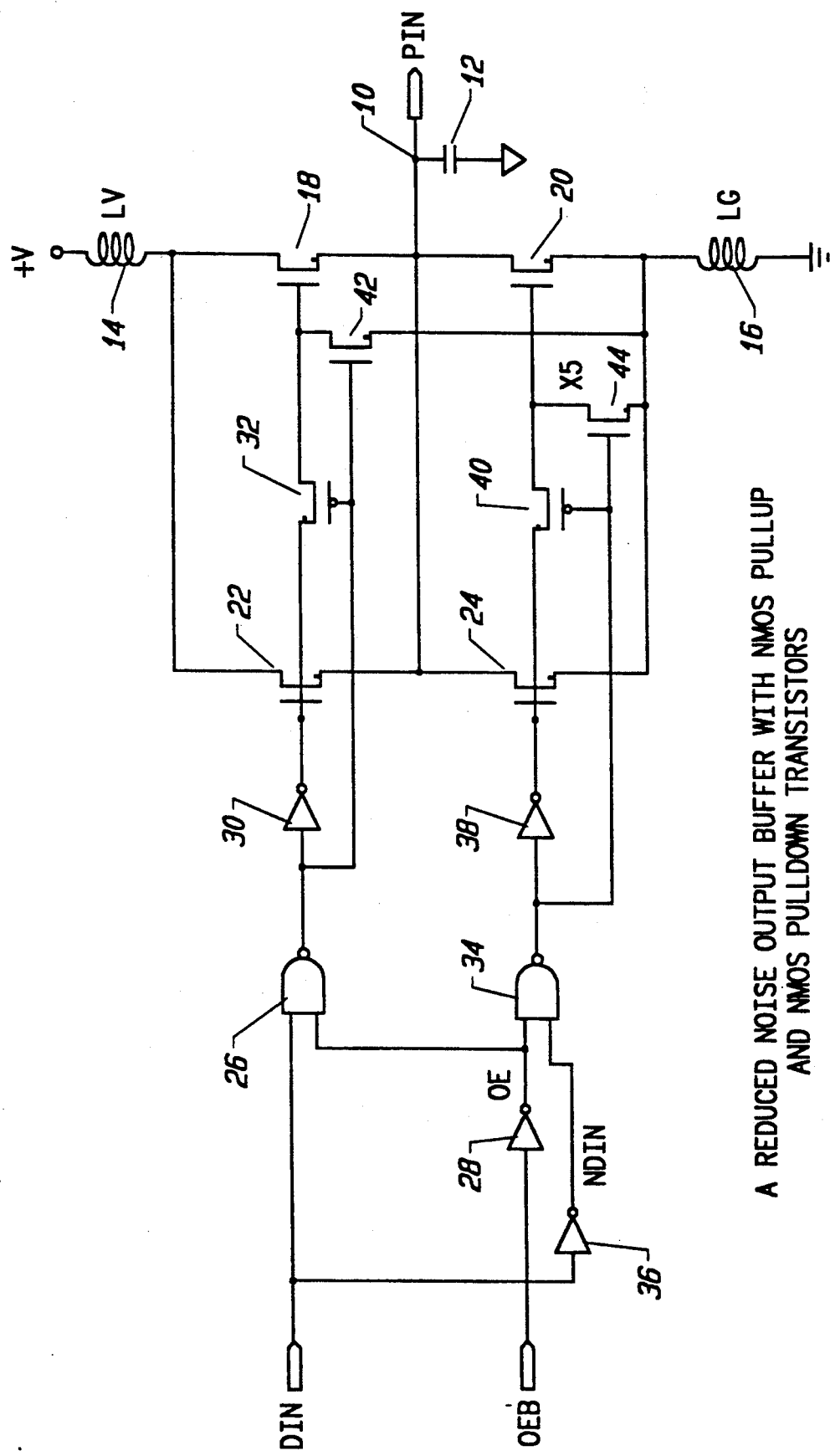

Referring now to the figure, an output buffer in accordance with one embodiment of the invention is illustrated schematically in which two internally generated signals, data in (DIN) and operation enable (OEB), determine the voltage on an output pin 10 and the capacitance 12 associated therewith. The voltage on the output pin 10 is either plus V or ground depending on the connection of the positive voltage (+V) and the ground connections to pin 10. Typically the external lead connections to the positive voltage supply and to ground are through external leads having inductance associated therewith as indicated by inductors 14 and 16. Thus, in charging capacitor 12 from the positive voltage supply through N channel FET 18, a voltage is generated across inductor 14 given by $$V = L\, di/dt$$

where L is the value of the inductance and di/dt is the time rate of change of current across the inductor. Similarly, when the capacitor 12 is discharged to ground through N channel FET 20, a voltage is generated across inductor 16. The inductive voltage is increased with the switching of multiple outputs on a device, resulting in the internal ground reference network being at a different potential than the external ground, which leads to device inputs and outputs behaving differently than expected.

In accordance with the invention, the rate at which the output pin charges and discharges is slowed thereby making di/dt smaller and consequently reducing the amount of noise voltage developed across the ground lead inductor and the plus voltage supply inductor. A second pair of N channel FET transistors 22 and 24 are serially connected between the +V supply and ground with the common terminal of the two transistors connected to the output pin 10. Transistors 22, 24 are smaller than transistors 18,20 and thus conduct less current when on. Biasing means is provided to turn on either transistor 22 or 24 before either transistor 18 or 20 becomes conductive. This results in a slower charge or discharge of the output pin 10 which reduces the time rate of change of current, di/dt, through the inductors, and consequently reduces the noise voltage developed on pin 10.

The biasing circuitry for N channel transistors 18, 22 includes a first NAND gate 26 which has inputs coupled to the DIN terminal and to the OEB terminal through inverter 28, thereby applying an operation enable (OE) signal to an input of NAND gate 26. The output of NAND gate 26 is applied through inverter 30 to the gate of transistor 22 and directly to the gate of P channel transistor 32 which interconnects the gate terminals of transistors 22 and 18. Similarly, a second NAND gate 34 has inputs connected to the operation enable (OE) signal and to the DIN signal through inverter 36. Thus, NAND gate 34 receives the operation enable, OE, and the not DIN or NDIN signals as inputs. The output of the second NAND gate 34 is coupled through inverter 38 to the gate terminal of N channel transistor 24 and directly to the gate of a second P channel transistor 40. The P channel transistors 32,40 connect the bias voltage applied to the gates of transistors 22,24 to the gate terminals of the larger transistors 18,20. Both of the P channel transistors are weak devices having large on resistance which causes the voltages on the gates of transistors 18,20 to go high at a slower rate than the gate bias voltage on transistors 22,24. Hence the larger NMOS devices turn on more slowly thus causing the output load to charge and discharge more slowly.

N channel transistors 42 and 44 are connected between the gate terminals of transistors 18 and 20, respectively, and ground. Transistor 42 is rendered conductive and latches transistor 18 off when the output pin 10 is at ground potential. Similarly, N channel transistor 44 is conductive and latches transistor 20 off when the output pin 10 is at the +V potential.

An important feature of the invention is the use of programmable P channel FETs 32,40 for delaying the bias voltage to the gates of the larger charging and discharging transistors 18,20. The programmability can be achieved with a minimal number of mask changes, typically a one mask change. For example a polysilicon layer change can be used; other one mask changes could include metal or contact. By making the channel length of the P channel device longer, the larger output N channel FETs are turned on slower and the amount of noise generated is low. By making the P channel device stronger, the buffer speed can be increased but the amount of noise generated is high. So it is possible to very easily pick a value of the PFET size that will satisfy any noise vs speed criteria.

In accordance with another feature of the invention, the buffer output is tristated when the OEB signal is high and transistors 42, 44 are conductive, whereupon output 10 has high impedance.

There has been described an improved output buffer having less noise by controlling the rate of charge and discharge of the voltage on the output pin. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A buffer circuit for controlling the voltage on an output pin in response to a data input signal (DIN) of high and low voltage levels and an operation enable bar signal (OEB) of high and low voltage levels comprising:
    a ground terminal,
    a voltage supply terminal,
    an output terminal,
    first and second N channel FETs serially connected between said ground terminal and said voltage supply terminal and having a common terminal, said common terminal being connected to said output terminal,
    third and fourth N channel FETs serially connected between said ground terminal and said voltage supply terminal and having a common terminal, said common terminal being connected to said output terminal, said third and fourth N channel FETs being smaller than said first and second N channel FETs,
    first logic means responsive to said DIN signal being at a high voltage level and to said OEB signal being at a low voltage level for applying a conductive bias voltage to said third N channel FET;
    second logic means responsive to said DIN signal being at a low voltage level and to said OEB signal being at a low voltage level for applying a conductive bias voltage to said fourth N channel FET,
    a first P channel FET having a gate terminal connected to said first logic means coupled and responsive to said conductive bias voltage from said first logic means and coupling said conductive bias voltage on said third N channel FET to said first N channel FET, and a second P channel FET having a gate terminal connected to said second logic means coupled and responsive to said conductive bias voltage from said second logic means and coupling said conductive bias voltage on said fourth N channel FET to said second N channel FET,
    said first P channel FET and said second P channel FET being weak conductors and limiting the rate at which conductive bias voltage is applied to said first N channel FET and to said second N channel FET.

2. The buffer circuit as defined by claim 1 wherein said first and second P channel FETs are programmable in conductance whereby switching speed and switching noise of the buffer circuit can be adjusted.

3. The buffer circuit as defined by claim 1 wherein all of said FETs have gate terminals for receiving conductive bias voltage and further including:
    a fifth N channel FET connected between the gate terminal of said first channel FET and said ground terminal,
    a sixth N channel FET connected between the gate terminal of said second N channel FET and said ground terminal,
    said first logic means applying conductive bias to said fifth N channel FET when said DIN signal is at a low voltage level, and said second logic means applying a conductive bias voltage to said sixth N channel FET when said DIN signal is at a high voltage level.

4. The buffer circuit as defined by claim 3 wherein said first logic means applies conductive bias voltage to said fifth N channel FET when said OEB signal is at a high voltage level, and said second logic means applies conductive bias voltage to said sixth N channel FET when said OEB signal is at a high voltage level.

5. The buffer circuit as defined by claim 4 wherein said first logic means applies conductive bias voltage to said first P channel FET when said DIN signal is at a high voltage level and said OEB signal is at a low voltage level, and said second logic means applies conductive bias to said second P channel FET when said DIN signal is at a low voltage level and said OEB signal is at a low voltage level.

6. The buffer circuit as defined by claim 5 wherein said first logic means comprises a first NAND gate having inputs coupled to the DIN signal and to the OEB signal and an output coupled to the gate terminals of said first P channel FET and said fifth N channel FET and coupled through an inverter to the gate terminal of said third N channel FET, and wherein said second logic means comprises a second NAND gate having inputs coupled to the DIN signal and to the OEB signal and an output coupled to the gate terminals of said second P channel FET and said sixth N channel FET and through an inverter to the gate terminal of said fourth N channel FET.

7. The buffer circuit as defined by claim 1 wherein said first logic means comprises a first NAND gate having inputs coupled to the DIN signal and to the OEB signal and an output coupled to the gate terminal of said first P channel FET and coupled through an inverter to the gate terminal of said third N channel FET, and wherein said second logic means comprises a second NAND gate having inputs coupled to the data input signals and the output enable signal and an output coupled to the gate terminal of said second P channel FET and through an inverter to the gate terminal of said fourth N channel FET.

8. The buffer circuit as defined by claim 7 wherein said output terminal is at a high impedance tristate when said OEB signal is high.

9. A buffer circuit for controlling the voltage on an output pin in response to a data input signal (DIN) of high and low voltage levels and an output enable bar signal (OEB) of high and low voltage levels comprising:
a ground terminal,
an output terminal,
a first N channel FET connecting said output terminal to said ground terminal,
a second N channel FET connecting said output terminal to said ground terminal, said second N channel FET being smaller than said first N channel FET,
logic means responsive to said DIN signal being low and said OEB signal being low for applying a conduction bias voltage to said second N channel FET, and
a P channel FET having a gate terminal connected to said logic means and responsive to said conductive bias voltage from said logic means and coupling said conductive bias voltage on said second N channel FET to said first N channel FET, said P channel FET being a weak conductor and limiting the rate at which conductive bias voltage is applied to said first N channel FET.

10. The buffer circuit as defined by claim 9 wherein said N channel FETs and said P channel FET have gate terminals and further including a third N channel FET connected between the gate terminal of said first N channel FET and said ground terminal, said logic means applying a conductive bias voltage to said third N channel FET when said data input signal is at high voltage level.

11. The buffer circuit as defined by claim 10 wherein said logic means comprises a NAND gate having inputs coupled to said data input signal and to the output enable signal and an output coupled to the gate terminals of said P channel FET and said third N channel FET and coupled through an inverter to the gate terminal of said second N channel FET.

12. The buffer circuit as defined by claim 9 wherein said N channel FETs and said P channel FET have gate terminals and wherein said logic means comprises a NAND gate having inputs coupled to said DIN signal and to the OEB signal and an output coupled to the gate terminal of said P channel FET and coupled through an inverter to the gate terminal of said second N channel FET.

13. The buffer circuit as defined by claim 9 wherein said P channel FET is programmable in conductance whereby switching speed and switching noise of the buffer circuit can be adjusted.

14. A buffer circuit for controlling the voltage on an output pin in response to a data input signal (DIN) of high and low voltage levels and an operation enable bar signal (OEB) of high and low voltage levels comprising:
a voltage supply terminal,
an output terminal,
a first N channel FET connecting said output terminal to said voltage supply terminal,
a second N channel FET connecting said output terminal to said voltage supply terminal, said second N channel FET being smaller than said first N channel FET,
logic means responsive to said DIN signal being high and said OEB signal being low for applying a conduction bias voltage to said second N channel FET, and
a P channel FET having a gate terminal connected to said logic means and responsive to said conductive bias voltage from said logic means and coupling said conductive bias voltage on said second N channel FET to said first N channel FET, said P channel FET being a weak conductor and limiting the conductive bias voltage applied to said first N channel FET.

15. The buffer circuit as defined by claim 14 wherein said N channel FETs and said P channel FET have gate terminals and further including a third N channel FET connected between the gate terminal of said first N channel FET and a ground terminal, said logic means applying a conductive bias voltage to said third N channel FET when said data input signal is at low voltage level.

16. The buffer circuit as defined by claim 15 wherein said logic means applies a conductive bias voltage to said third N channel FET when said OEB signal is high.

17. The buffer circuit as defined by claim 15 wherein said logic means comprises a NAND gate having inputs coupled to said DIN signal and to the OEB signal and an output coupled to the gate terminals of said P channel FET and said third N channel FET and coupled through an inverter to the gate terminal of said second N channel FET.

18. The buffer circuit as defined by claim 14 wherein said N channel FETs and said P channel FET have gate terminals and wherein said logic means comprises a NAND gate having inputs coupled to said DIN signal and to the OEB signal and an output coupled to the gate terminal of said P channel FET and coupled through an inverter to the gate terminal of said second N channel FET.

19. The buffer circuit as defined by claim 14 wherein said P channel FET is programmable in conductance whereby switching speed and switching noise of the buffer circuit can be adjusted.

20. The buffer circuit as defined by claim 10 wherein said logic means applies a conductive bias voltage to said third N channel FET when said OEB signal is high.

* * * * *